United States Patent

[11] 3,573,644

[72] Inventor Eddie A. Evel
Colorado Springs, Colo.

[21] Appl. No. 808,777
[22] Filed Mar. 20, 1969
[45] Patented Apr. 6, 1971
[73] Assignee Hewlett-Packard Company
Palo Alto, Calif.

[54] DC STABILIZED WIDE BAND AMPLIFIER
2 Claims, 1 Drawing Fig.

[52] U.S. Cl. .......... 330/9, 330/69
[51] Int. Cl. .......... H03f 1/02
[50] Field of Search .......... 330/9, 69, 30 (D)

[56] References Cited

UNITED STATES PATENTS

| | | | |
|---|---|---|---|
| 3,147,446 | 9/1964 | Wittenberg | 330/9 |
| 3,218,566 | 11/1965 | Hayes, Jr. | 330/9 |
| 3,353,033 | 11/1967 | Gilbert | 330/9X |
| 3,448,289 | 6/1969 | Harris | 330/9X |

*Primary Examiner*—Nathan Kaufman
*Attorney*—Stephen P. Fox

ABSTRACT: A wideband stabilized wide band amplifier is constructed to have two signal paths, one designed for optimum high-frequency performance and the other designed for optimum low frequency and DC performance. The signals in the two paths are combined in a differential amplifier and the output fed back to the DC signal path in such a manner that any DC signal drift in the AC signal path is reduced.

Patented April 6, 1971 3,573,644
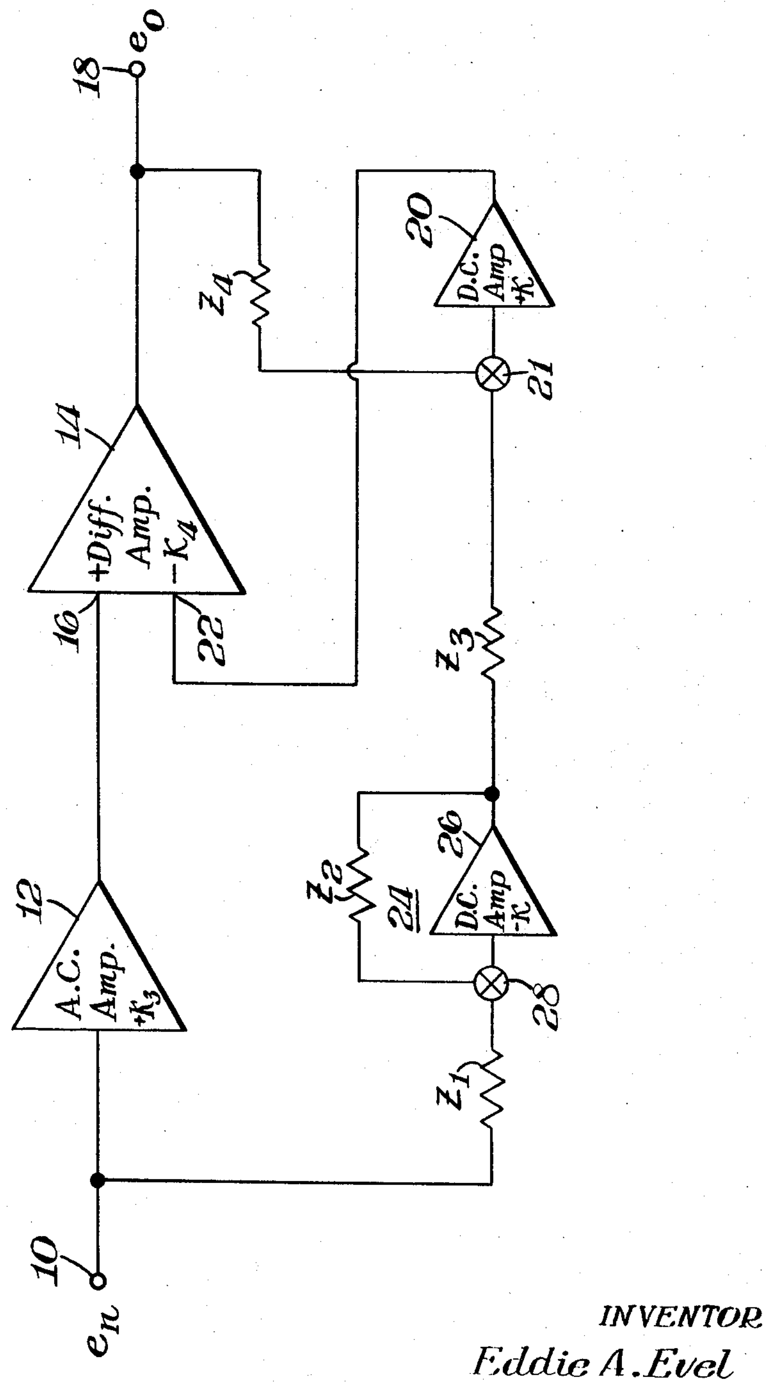
INVENTOR
Eddie A. Evel
BY
Mortenson and Weigel
ATTORNEYS

DC STABILIZED WIDE BAND AMPLIFIER

BACKGROUND OF THE INVENTION

With the advent of television and even before it became necessary to provide amplifiers capable of operating over a relatively wide range of frequencies. Typically, such amplifiers should be capable of amplifying relatively high-frequency signals. On the other hand, the low frequencies they must amplify go down to and include direct current components. High-frequency amplification became necessary in television because of the requirement of amplifying pulses without introducing distortion. Such amplifiers have a very wide use in today's electronic industry.

Among the design problems encountered in such amplifiers are that amplification may be optimized for either the higher frequency signals or the lower frequency signals, either being at the sacrifice of the other. If the high-frequency characteristics or performance of the amplifier are optimized, the DC amplification suffers and often there are problems with DC drift.

Accordingly, it is an object of this invention to provide an improved wideband amplifier that is stabilized for temperature drift and at the same time allows improvement of the high-frequency performance of the amplifier.

BRIEF DESCRIPTION OF THE INVENTION

A wideband amplifier system is designed to have a system input adapted to receive an input signal to be amplified. The amplifier system includes a difference circuit means having first and second inputs and an output which provides the system output. The first input of the difference circuit means is coupled to receive the input signal. The input signal is also coupled through a first impedance means to a direct current amplifier. The output of the direct current amplifier is connected to the second input of the difference circuit means and the output of the difference circuit means is fed back through a feedback impedance to the input of the direct current amplifier, such that the direct current amplifier functions as an operational amplifier with the difference circuit means in the feedback loop. By this arrangement, the amplified direct current signal applied to the difference circuit means overrides any DC gain error or DC drift in the AC amplifier portion of the system.

DESCRIPTION OF THE DRAWINGS

The novel features that are considered characteristic of this invention are set forth with particularity in the appended claims. The invention itself, however, both as to its organization and method of operation, as well as additional objects and advantages thereof, will be best understood from the following description when read in connection with the accompanying drawings in which the sole FIGURE is a partial block, partial circuit diagram of a preferred form of the invention.

DESCRIPTION OF THE PREFERRED EMBODIMENT

In the sole FIGURE, there is seen a simplified block-schematic diagram of a direct current DC stabilized wideband amplifier system constructed in accordance with this invention. This amplifier system utilizes a feedback amplifier arrangement in such a way that there are in essence two signal paths in the system, one for high frequency and another for low frequencies and DC. More specifically, an input signal $e_n$ may be applied to the input terminal 10 of the system. The input terminal 10 couples the input signal $e_n$ to the input of an alternating current AC amplifier 12 having a gain designated by the symbol $+K_3$. The AC amplifier 12 is designed in a conventional manner to have optimum high-frequency performance over the frequency range desired. The output of the amplifier 12 is coupled to one input of a difference circuit means which preferably is a wideband differential amplifier 14. A differential amplifier is an amplifier whose input leads respond to differential signals. The output of the differential amplifier 14 is coupled to an output terminal 18 at which the system output signal $e_o$ is available and also through a feedback impedance, designated by the symbol $Z_4$, to the summing point 21 of a high gain DC amplifier 20. The output of the DC amplifier 20 is coupled to the second input 22 of the differential amplifier 14.

From the input terminal 10, the second input signal $e_n$ is also coupled through an operational amplifier 24 which includes a high gain direct current amplifier 26. In addition, the amplifier 26 has a feedback impedance $Z_2$ connected around the DC amplifier 26 to the summing point 28. The input signal $e_n$ is coupled to the DC amplifier 26 through an input impedance $Z_1$. Since operational amplifiers in themselves are well known, they need not be described further. The output of the operational amplifier 24 is coupled through an input impedance $Z_3$ to the summing point 21 of the DC amplifier 20. In practice the impedances $Z_1$, $Z_2$, $Z_3$ and $Z_4$ may be resistors.

In its operation, the DC portion of any input signal $e_n$ applied to the input of the system 10 is amplified by the operational amplifier 24 and develops an output voltage signal $$\frac{-Z_2}{Z_1}\cdot e_n$$

This output voltage signal is applied through the input impedance $Z_3$ to the high gain DC amplifier 20 where it is amplified and applied to the input terminal 22 of the differential amplifier 14. If there is any difference in the DC signals between the two input terminals 16 and 22, such difference is amplified by the differential amplifier 14 and appears at the output terminal 18 as an output signal $e_0$. In addition, the output signal $e_0$ is fed back through the feedback impedance $Z_4$ to the summing point 21 at the input of the high gain DC amplifier 20 in such a phase that it tends to reduce the signal applied to the summing junction through the input impedance $Z_3$ from the operational amplifier 24. Since the amplifier 20 has a high gain, the two amplifiers 20 (the DC amplifier) and 14 (the differential amplifier) form an operational amplifier in which the impedance $Z_4$ is the feedback impedance and the input impedance $Z_3$ is the input impedance. Because of this feedback arrangement, the DC signal applied to the lower (in the drawing) input 22 of the differential amplifier 14 tends to override the DC signal applied to the other input terminal 16. Therefore, any DC gain error or any DC drift due to temperature or otherwise in the alternating current amplifier 12 is reduced by the feedback. DC drift in the differential amplifier 14 is reduced typically to an insignificant level by the gain of the DC amplifier 20. Thus, the DC drift performance and characteristics of the amplifier system is controlled almost entirely by the DC amplifiers 20 and 26.

The higher frequency components of the input signal $e_n$ are amplified as a decreasing function of frequency by the amplifiers 20 and 24 until the gain actually approaches zero at the higher frequencies. At this point, the amplifiers 12 and 14 operate as an ordinary high-frequency amplifier with the input to the terminal 22 of the differential amplifier 14 approaching zero. Since the gain of the DC amplifier 20 is low at these higher frequencies, it has little effect upon the output signal $e_0$.

By employing design criteria such that the high-frequency gain of the two amplifiers 12 and 14 is equal to the DC gain provided by the two operational amplifier systems 20 and 24, i.e., $$K_3\cdot K_4=\frac{Z_2}{Z_1}\cdot\frac{Z_4}{Z_3}$$

and the cutoff frequency of the DC amplifier 20 is properly chosen, there is little change in the frequency response of the amplifier system during the transition from the low-frequency signal path 24—20 to the higher frequency signal path 12—14 to the output terminal 18. This has the advantage that since the two high-frequency amplifiers 12 and 14 have little or no effect upon the DC performance of the system, they can be designed to have optimum high-frequency performance characteristics. In fact, they may be combined, if desired, into one amplifier or DC coupled. In the alternative, either or both may be a passive network. On the other hand, the DC amplifiers 20 and 26 preferably are designed to have optimum DC performance since they must operate at the low frequencies only. In alternative embodiments, these latter two amplifiers may be combined into one amplifier with very slight modifications of the connections illustrated.

It is obvious that many embodiments may be made of this inventive concept and that many modifications may be made in the embodiments hereinbefore described. Therefore, it is to be understood that all descriptive matter herein is to be interpreted merely as illustrative, exemplary, and not in a limited sense. It is intended that various modifications which might readily suggest themselves to those skilled in the art be covered by the following claims as far as the prior art permits.

I claim:

1. In an amplifier system having a signal input terminal and a signal output terminal, the combination of:

a differential amplifier having first and second inputs, and an output coupled to said system signal output terminal, said differential amplifier having a linear, wide bandwidth alternating current frequency response and a predetermined gain;

first circuit means for coupling the first input of said differential amplifier to said system signal input terminal, said first circuit means including an alternating current amplifier having a wide bandwidth frequency response and a predetermined gain;

second circuit means for coupling the second input of said differential amplifier to said system signal input terminal, said second circuit means including:

a direct current amplifier having an input and an output, said output being coupled to the second input of said differential amplifier, said direct current amplifier having a predetermined gain;

a direct current operational amplifier having an input and an output, said input being coupled to said system signal input terminal, said operational amplifier having a selectable gain; and impedance means for coupling the input of said first-named direct current amplifier to the output of said direct current operational amplifier;

a single feedback path including feedback impedance means for coupling the output of said differential amplifier to the input of said first-named direct current amplifier; and said second circuit means and said feedback impedance means being operable to provide a feedback signal having a magnitude which is a decreasing function of the frequency of the signal applied to said system input terminal to override any direct current drift in said differential amplifier.

2. A system according to claim 1 wherein the product of the gains of said alternating current amplifier and said differential amplifier is substantially equal to the product of the gains of said direct current amplifiers whereby the gain of said system is substantially independent of the frequency of the input signal.